United States Patent [19]
Nagai et al.

[11] Patent Number: 6,040,615
[45] Date of Patent: Mar. 21, 2000

[54] SEMICONDUCTOR DEVICE WITH MOISTURE RESISTANT FUSE PORTION

[75] Inventors: Yukihiro Nagai; Tomoharu Mametani, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/059,280

[22] Filed: Apr. 14, 1998

[30] Foreign Application Priority Data

Nov. 20, 1997 [JP] Japan ..................... 9-319447

[51] Int. Cl.⁷ ................... H01L 29/00; H01L 23/58; H01L 23/62
[52] U.S. Cl. ..................... 257/529; 257/665; 257/173
[58] Field of Search .................... 257/665, 529, 257/173, 910

[56] References Cited

U.S. PATENT DOCUMENTS

| | | | |
|---|---|---|---|
| 5,420,455 | 5/1995 | Gilmour et al. | 257/665 |
| 5,652,459 | 7/1997 | Chen | 257/529 |
| 5,663,590 | 9/1997 | Kapoor | 257/665 |
| 5,760,453 | 7/1998 | Chen | 257/529 |
| 5,789,794 | 8/1998 | Froehner | 257/529 |
| 5,882,998 | 3/1999 | Sur, Jr. et al. | 257/529 |

FOREIGN PATENT DOCUMENTS

| | | | |
|---|---|---|---|
| 358123759 | 7/1983 | Japan | 257/529 |
| 4-14246 | 1/1992 | Japan . | |
| 7-78872 | 3/1995 | Japan . | |

*Primary Examiner*—Mahshid Saadat
*Assistant Examiner*—Jesse A. Fenty
*Attorney, Agent, or Firm*—McDermott, Will & Emery

[57] ABSTRACT

On a semiconductor substrate, a first circuit and a second circuit are provided with a space therebetween. The first circuit and the second circuit are connected to each other by a fuse portion. In the middle of the fuse portion, a connecting portion is interposed, which is made of a material highly resistant to corrosion. Accordingly, an improved semiconductor device with a corrosion-resisting fuse portion is accomplished, which ensures the layout to be designed much more freely.

6 Claims, 12 Drawing Sheets

FIG.1

FUSE PORTION

FIG.2

FUSE PORTION

FIG.3

FUSE PORTION

FIG.4

FUSE PORTION

FIG.5

FUSE PORTION

FIG.6

FUSE PORTION

FIG.7

FUSE PORTION  FUSE PORTION

FIG.8

FUSE PORTION  FUSE PORTION

FUSE PORTION

FIG.14  PRIOR ART

FUSE PORTION

FIG.15 PRIOR ART

FUSE PORTION

FIG.16 PRIOR ART

FUSE PORTION

FIG.17 PRIOR ART

FUSE PORTION

FIG.18 PRIOR ART

FUSE PORTION

SEMICONDUCTOR DEVICE WITH MOISTURE RESISTANT FUSE PORTION

BACKGROUND OF THE INVENTION

1. Field of the Invention

The present invention generally relates to a semiconductor device, and more particularly, to an improved semiconductor device in which a fuse portion is made more resistant to moisture.

2. Description of the Background Art

Figure 13:
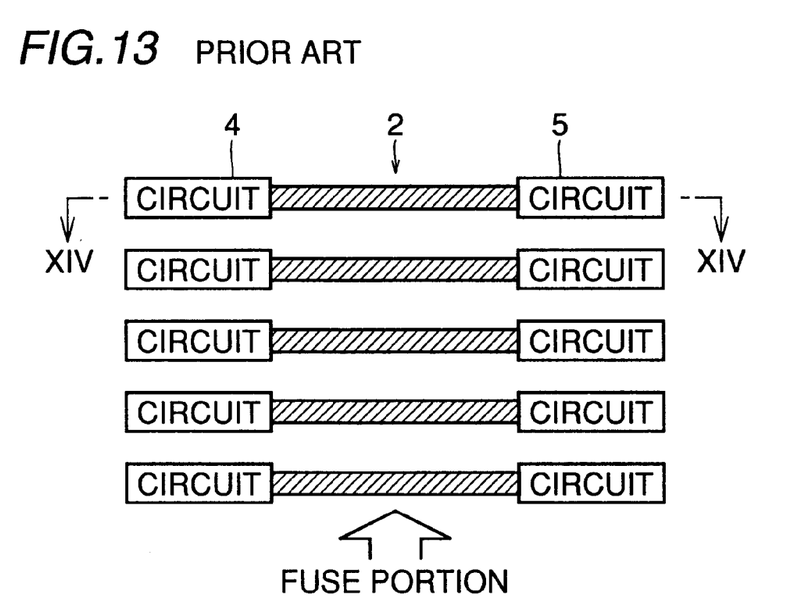
FIG. 13 is a top view of a conventional semiconductor device.
Figure 14:
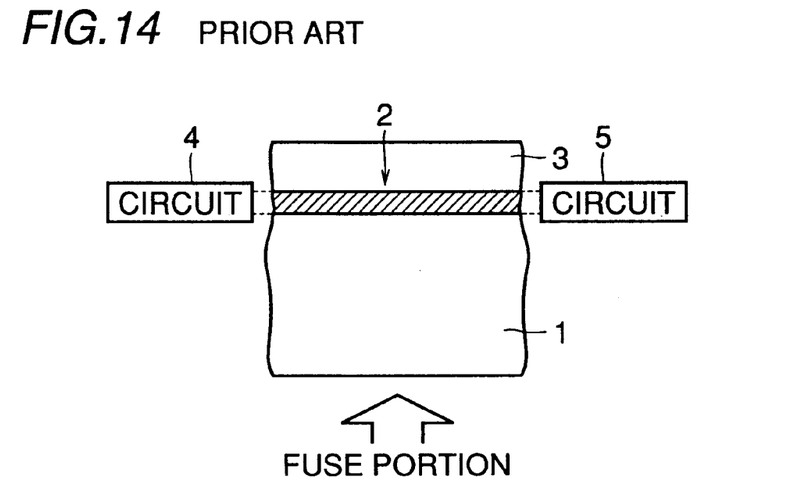
FIG. 14 is a cross sectional view of the device taken along the line XIV—XIV in FIG. 13.

FIG. 13 is a top view of a conventional semiconductor device which includes a fuse portion. FIG. 14 is a cross sectional view of the fuse portion of the semiconductor device shown in FIG. 13, taken along the line XIV—XIV. With reference to FIGS. 13 and 14, a first circuit 4 and a second circuit 5 are provided on a semiconductor substrate 1, spaced apart from each other. First circuit 4 and second circuit 5 are connected by a fuse portion 2. Fuse portion 2 is protected by an insulating film 3 provided on semiconductor substrate 1.

In the conventional semiconductor device, fuse portion 2 is made of the same material (Al, W or Wsi) as interconnections in circuits 4, 5.

Figure 15:
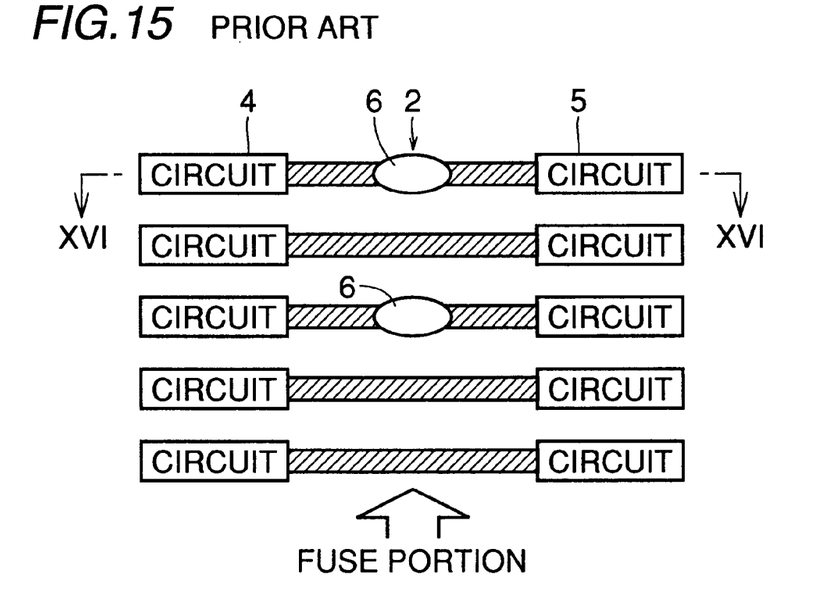
FIG. 15 is a top view of the conventional semiconductor device after laser blowing.
Figure 16:
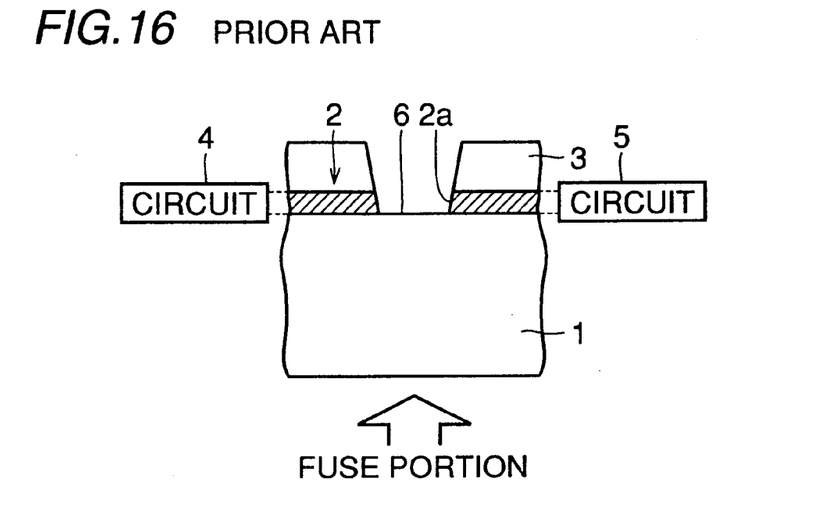
FIG. 16 is a cross sectional view of the device taken along the line XVI—XVI in FIG. 15.

FIG. 15 is a top view of a semiconductor device, illustrating the condition after laser blowing. FIG. 16 is a cross sectional view of the semiconductor device taken along the line XVI—XVI in FIG. 15. Blown by laser, fuse portion 2 is severed, so that first circuit 4 is electrically separated from second circuit 5. In a portion 6 where fuse portion 2 has been cut off, the oxide film 3, which had been covering the top of the fuse portion 2, is broken at the same time. Consequently, the end surface 2a of fuse portion 2 is exposed to moisture entering from the top.

Figure 17:
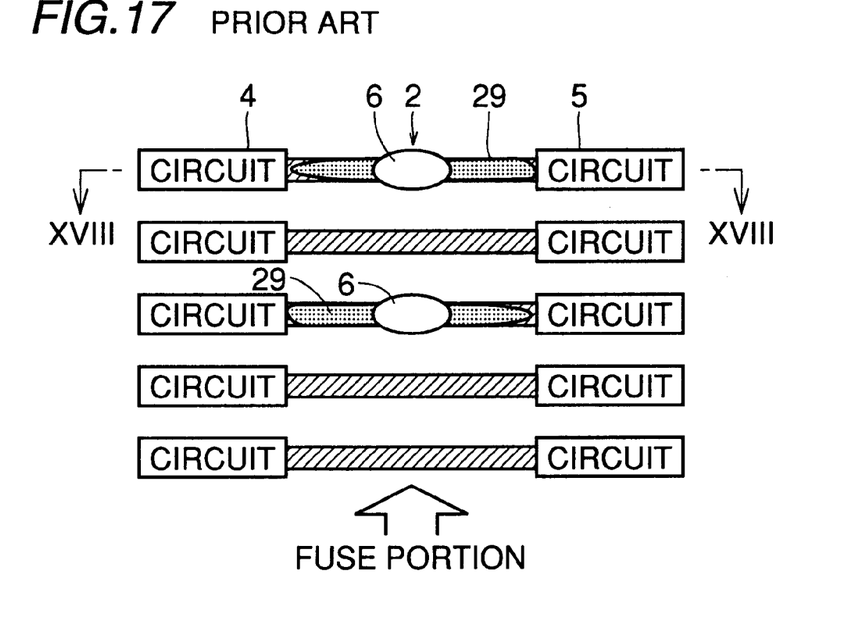
FIG. 17 is a top view of the conventional semiconductor device, illustrating a problem encountered by the device.
Figure 18:
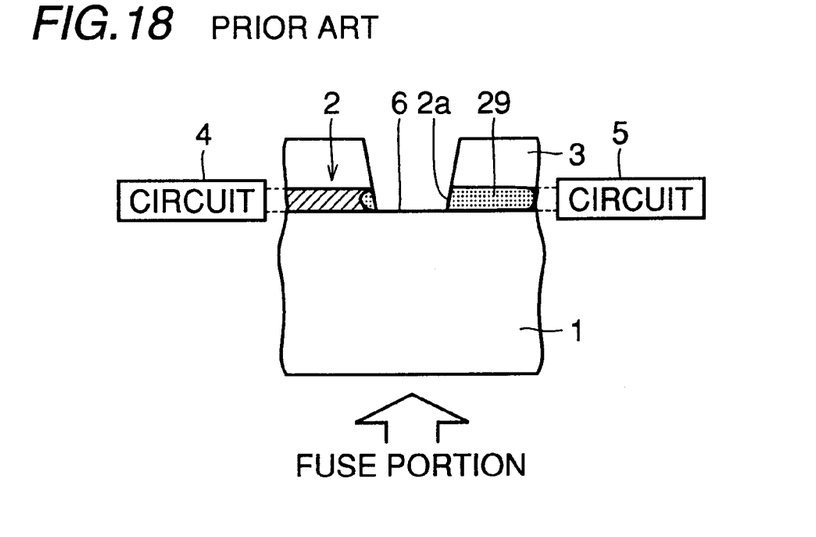
FIG. 18 is a cross sectional view of the device taken along the line XVIII—XVIII in FIG. 17.

FIG. 17 is a diagram illustrating a problem encountered by the conventional semiconductor device. FIG. 18 is a cross sectional view of the device taken along the line XVIII—XVIII in FIG. 17.

In the conventional semiconductor device, referring to FIGS. 17 and 18, the end surface 2a of the fuse portion is exposed to moisture entering from the top. If fuse portion 2 is made of a material which is vulnerable to moisture, corrosion will advance to fuse portion 2, and will destroy the interconnections in circuit 5 and also other fuse portions, thus resulting in a defective device. In FIGS. 17 and 18, a corroded portion in fuse portion 2 is denoted by a reference numeral 29.

Generally, a fuse portion is made of a conductive layer. However, it is very difficult to select for the fuse portion a material highly resistant against corrosion, because higher priority is given to a material which will guarantee a reduction in layout and easiness of blowing.

Figure 19:
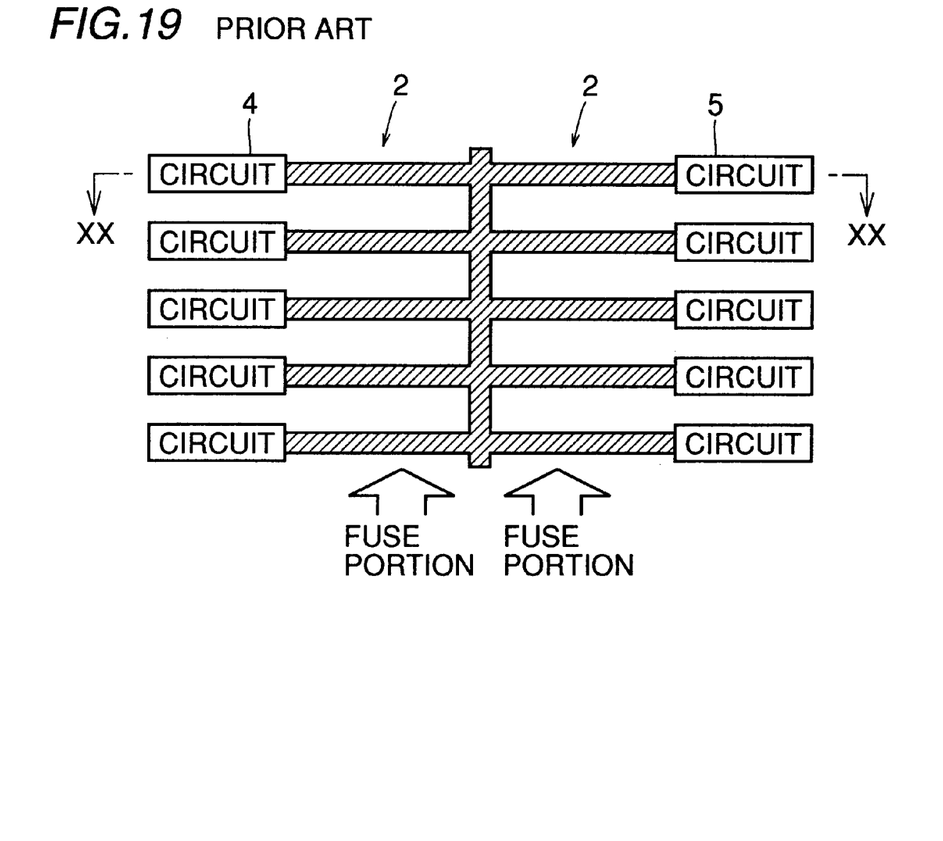
FIG. 19 is a top view of another conventional semiconductor device.
Figure 20:
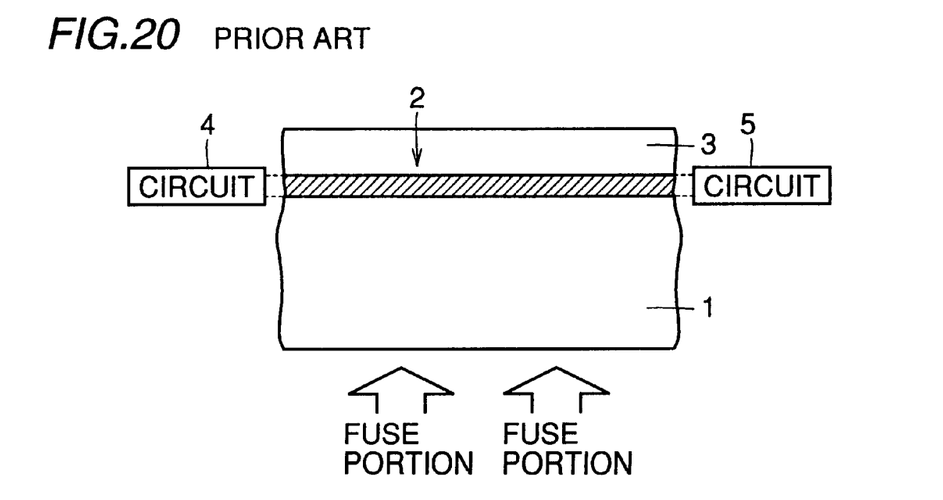
FIG. 20 is a cross sectional view of the device taken along the line XX—XX in FIG. 19.

FIG. 19 is a top view of a conventional semiconductor device in which a fuse portion is divided and separately arranged in two locations. FIG. 20 is a cross sectional view of the device taken along the line XX—XX in FIG. 19. The device shown in FIGS. 19 and 20 is the same as the conventional semiconductor device shown in FIG. 13, except that the former has fuse portion 2 which is divided and separately arranged in two locations. Therefore, the same or corresponding portions are designated by same reference characters, and description thereof is not repeated.

Figure 21:
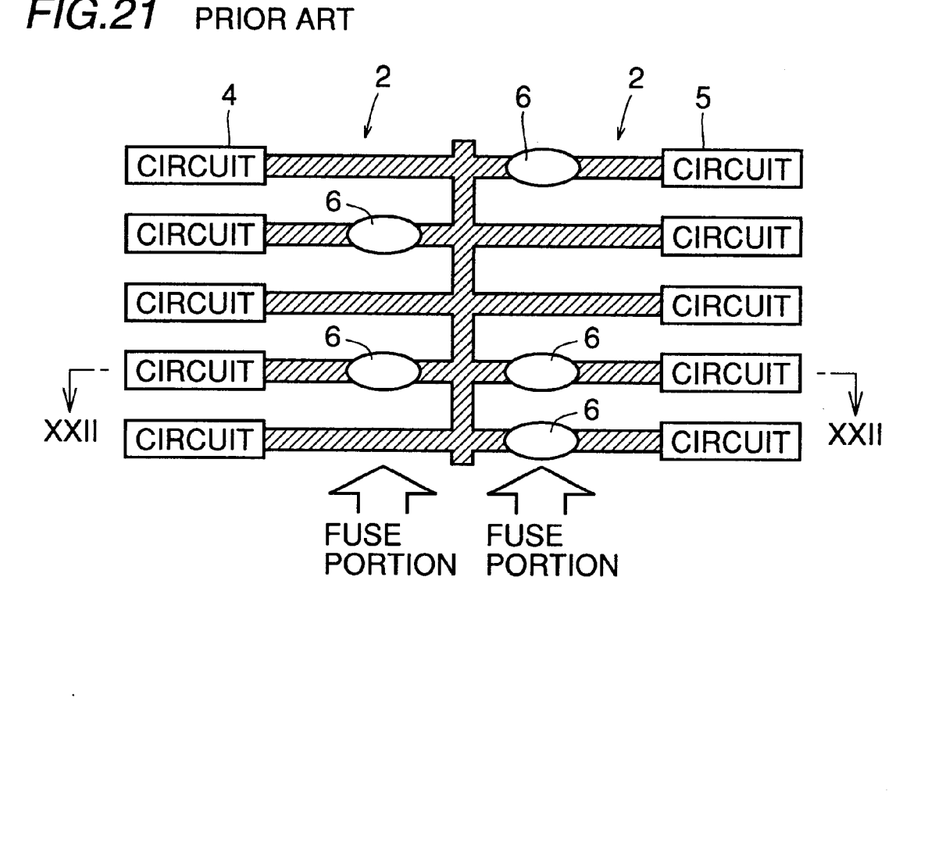
FIG. 21 is a top view of the conventional semiconductor device of FIG. 19 after laser blowing.
Figure 22:
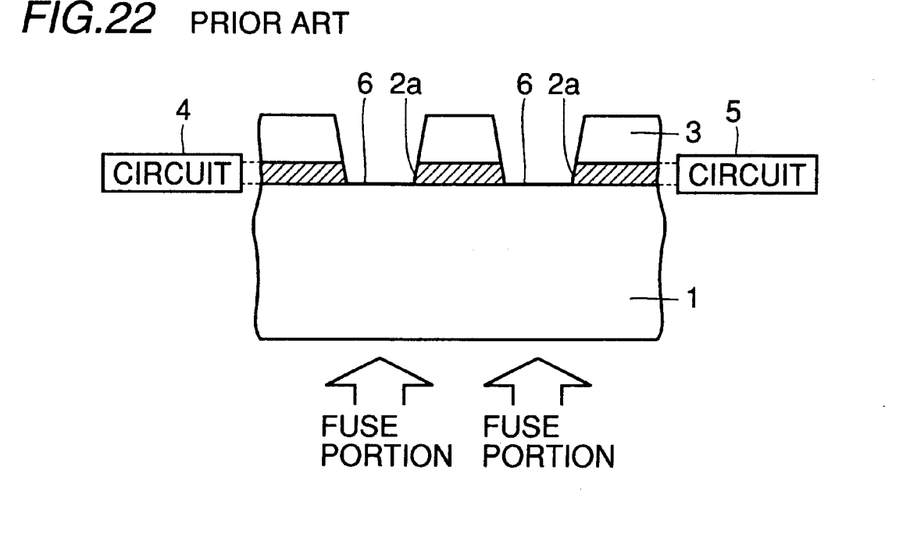
FIG. 22 is a cross sectional view of the device taken along the line XXII—XXII in FIG. 21.

FIG. 21 is a top view of a conventional semiconductor device with a fuse portion separated into two portions, illustrating its condition after laser blowing. FIG. 22 is a cross sectional view of the device taken along the line XXII—XXII in FIG. 20. In FIGS. 21 and 22, the portions same as or corresponding to the portions of the device shown in FIG. 15 are denoted by same reference characters, and description thereof is not repeated.

Figure 23:
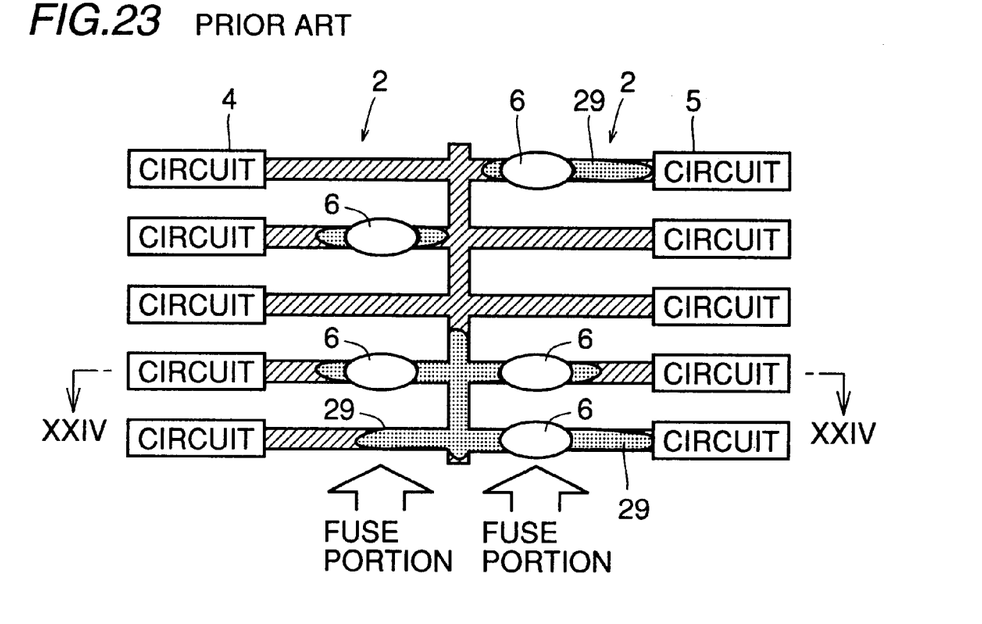
FIG. 23 is a diagram showing a problem encountered by the conventional semiconductor device of FIG. 19.
Figure 24:
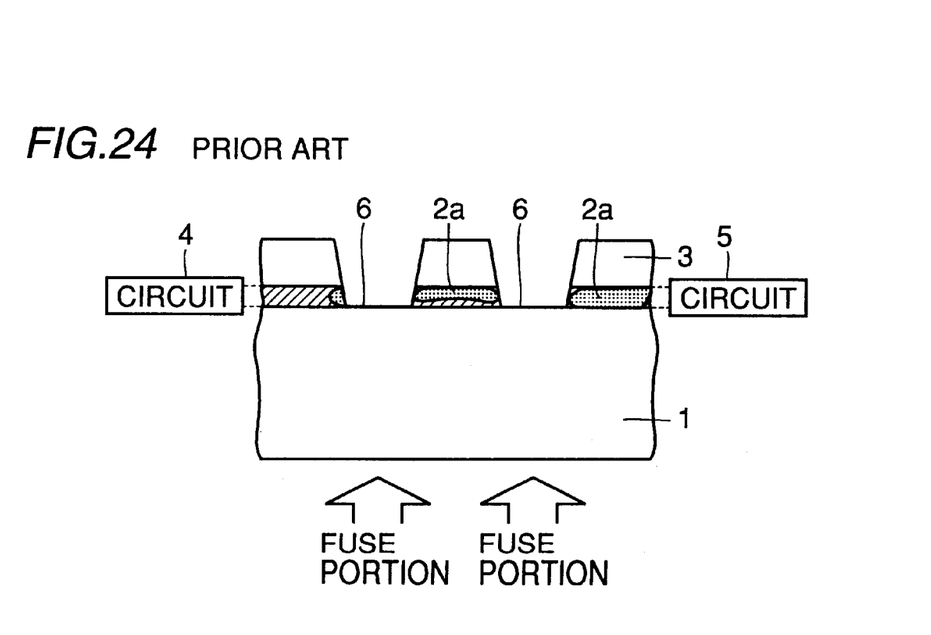
FIG. 24 is a cross sectional view of the device taken along the line XXIV—XXIV in FIG. 23.

FIG. 23 is a diagram illustrating a problem with a semiconductor device having a fuse portion divided and arranged in two locations. FIG. 24 is a cross sectional view of the device taken along the line XXIV—XXIV in FIG. 23. The portions same as or corresponding to the portions of the device shown in FIG. 17 are designated by same reference characters, and description thereof is not repeated.

In a conventional semiconductor device, the fuse portion which has been blown by laser is most susceptible to moisture. Such a vulnerability to moisture can cause corrosion to develop at the end surface of the blown fuse portion, which will advance along the fuse portion and destroy a circuit or other fuse portions. This can make a semiconductor device defective.

SUMMARY OF THE INVENTION

The present invention is thus directed to solve the problems described above. An object of the invention is to provide an improved semiconductor device in which a fuse portion is made more resistant to moisture.

A semiconductor device according to a first aspect of the present invention includes a semiconductor substrate, on which a first circuit and a second circuit are provided, spaced apart from each other. The first circuit is connected to the second circuit by a fuse portion. A connecting portion formed of a material highly resistant to corrosion is interposed in the middle of the fuse portion.

According to this aspect of the invention, by interposing the connecting portion made of a corrosion-resisting material in the middle of the fuse portion, corrosion can be prevented from advancing beyond the connecting portion, even when the fuse portion is cut off and its end surface is exposed to moisture.

According to a second aspect of the present invention, the fuse portion includes a first metal portion connected to the first circuit, and a first connecting portion connected to the first metal portion. The first connecting portion has a first trench formed on the surface of the semiconductor substrate, a first doped layer formed at the bottom of the first trench, and a first plug portion provided along the first trench and connecting the first metal portion and the first doped layer.

According to this aspect of the invention, the connecting portion is formed of the first doped layer highly resistant to corrosion. Therefore, even when an end surface of the first metal portion of the blown fuse portion is exposed and thus damaged by corrosion, the first doped layer will successfully prevent corrosion from advancing any further.

In a semiconductor device according to a third aspect of the present invention, the first plug portion is formed of W or Wsi, both of which are easy to be blown by laser.

In a semiconductor device according to a fourth aspect of the present invention, the first doped layer is a doped polysilicon layer. Such a doped layer is formed in an easy manner, for example, by doping a silicon substrate with impurities.

In a semiconductor device according to a fifth aspect of the present invention, the fuse portion includes a second metal portion connected to the second circuit, and a second connecting portion connected to the second metal portion. The second connecting portion has a second trench formed on the surface of the semiconductor substrate, a second doped layer formed at the bottom of the second trench, and a second plug portion provided along the second trench and connecting the second metal portion and the second doped layer.

According to this aspect of the invention, the fuse portion is divided and separately arranged in two locations between the first circuit and the second circuit. The fuse portion with such a structure also prevents the advance of corrosion.

In a semiconductor device according to a sixth aspect of the present invention, the second plug portion is formed of W or WSi, and thus is easy to be blown by laser.

In a semiconductor device according to a seventh aspect of the present invention, the second doped layer is a doped polysilicon layer. This can be readily formed, simply by doping polysilicon with impurities.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the drawings.

First Embodiment

Figure 1:
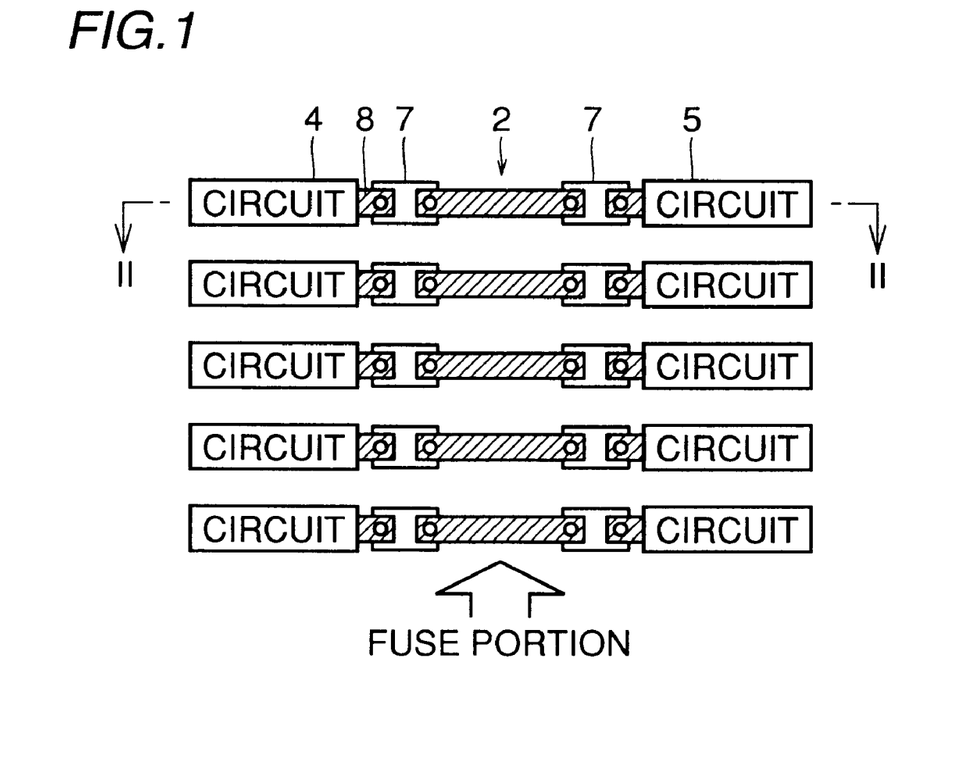
FIG. 1 is a top view of a semiconductor device according to a first embodiment of the present invention.
Figure 2:
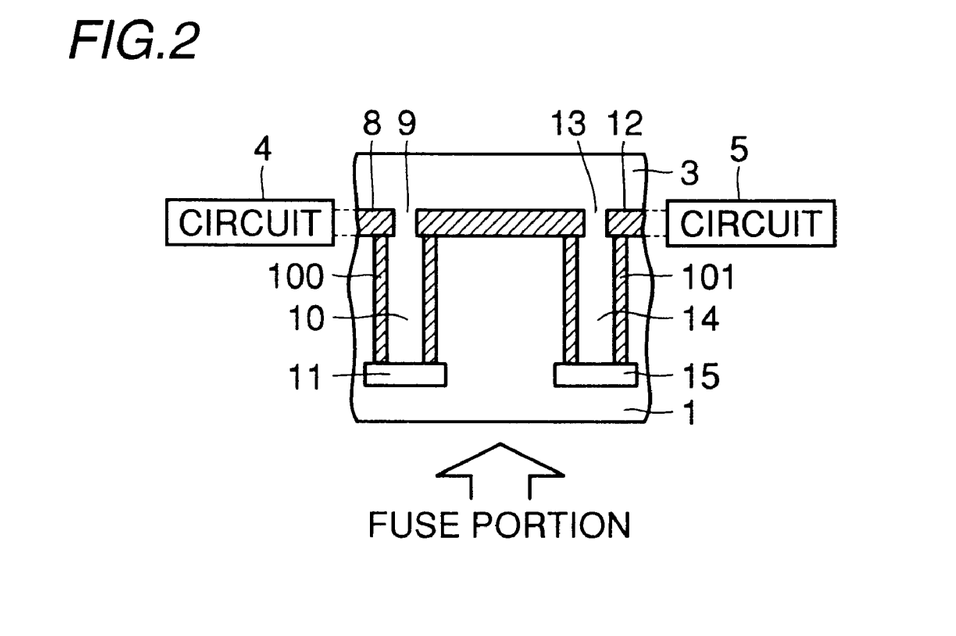
FIG. 2 is a cross sectional view of the device, taken along the line II—II shown in FIG. 1.

Referring to FIGS. 1 and 2, a semiconductor device according to the first embodiment includes a semiconductor substrate 1. A first circuit 4 and a second circuit 5 are provided on semiconductor substrate 1, spaced apart from each other. First circuit 4 is connected to second circuit 5 by a fuse portion 2. A connecting portion 7 formed of a material highly resistant to corrosion is interposed in the middle of fuse portion 2. An insulating film 3 is provided on semiconductor substrate 1 to cover fuse portion 2.

More specifically, referring to FIG. 2, fuse portion 2 includes a first metal portion 8 connected to first circuit 4, and a first connecting portion 9 connected to first metal portion 8. First connecting portion 9 has a first trench 10 formed on the surface of semiconductor substrate 1, a first doped layer 11 formed at the bottom of first trench 10, and a first plug portion 100 provided along first trench 10 and connecting first metal portion 8 and first doped layer 11.

Fuse portion 2 also includes a second metal portion 12 connected to second circuit 5, and a second connecting portion 13 connected to second metal portion 12. Second connecting portion 13 has a second trench 14 formed on the surface of semiconductor substrate 1, a second doped layer 15 formed at the bottom of second trench 14, and a second plug portion 101 provided along second trench 14 and connecting second metal portion 12 and second doped layer 15.

First and second plug portions 100, 101 are formed of W or WSi. First and second doped layers 11, 15 are doped polysilicon layers. First and second metal portions 8, 12 are formed of Al, which is vulnerable to corrosion, whereas first and second plug portions 100, 101, formed of W or WSi, are resistant to corrosion. Doped polysilicon layers 11, 15 are absolutely corrosion-free.

Figure 3:
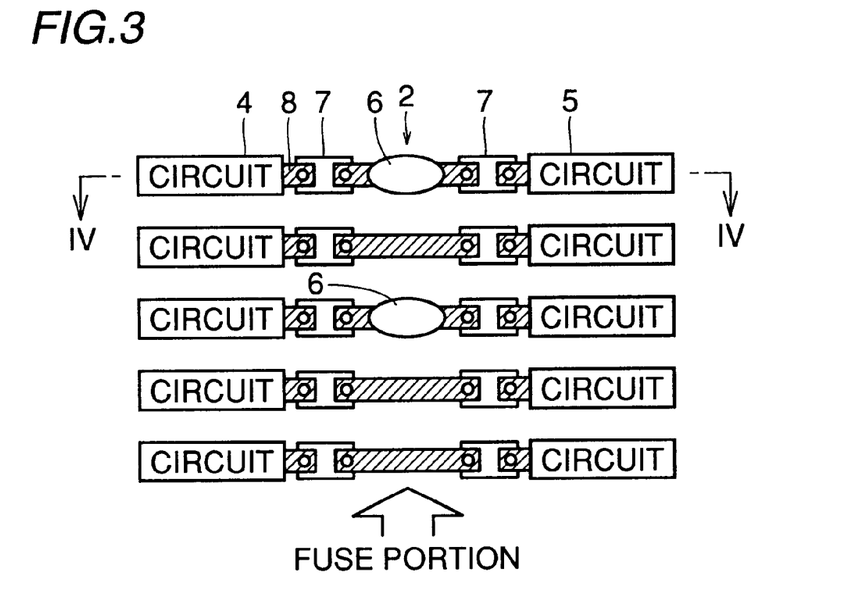
FIG. 3 is a top view of the semiconductor device after laser blowing has been performed.
Figure 4:
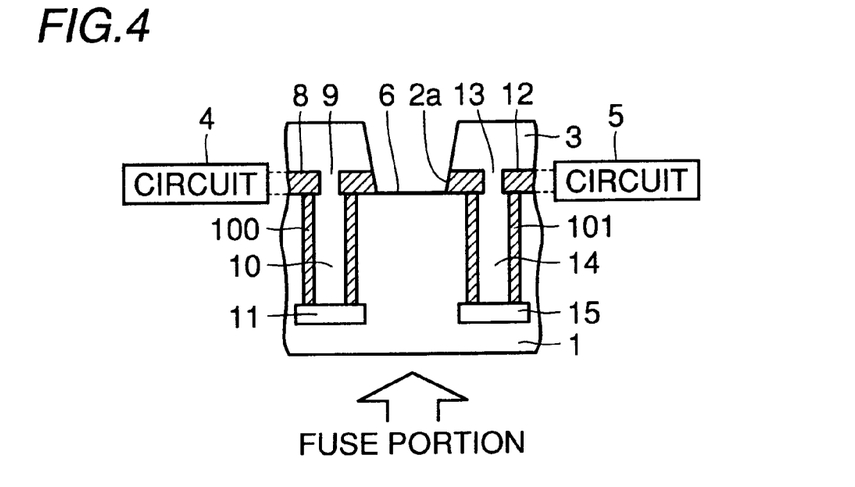
FIG. 4 is a cross sectional view of the device, taken along the line IV—IV shown in FIG. 3.

FIG. 3 is a top view of the semiconductor device after laser blowing has been conducted. FIG. 4 is a cross sectional view of the device taken along the line IV—IV in FIG. 3. Referring to FIGS. 3 and 4, a portion blown out by laser is denoted by a reference numeral 6.

Figure 5:
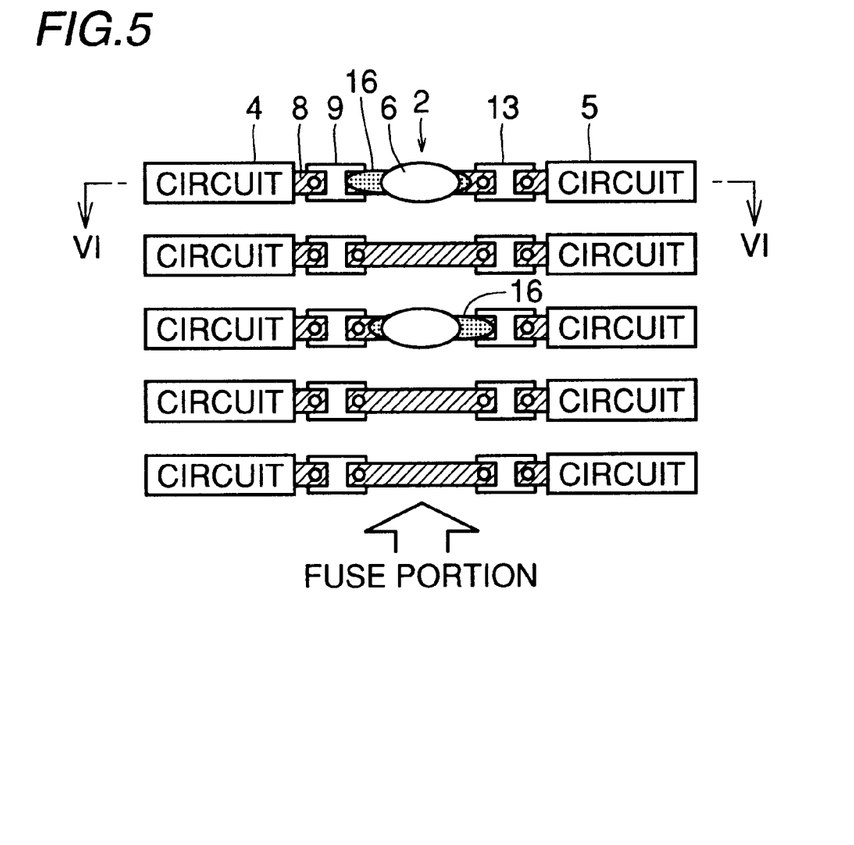
FIG. 5 is a diagram illustrating an effect achieved by a semiconductor device according to the first embodiment of the present invention.
Figure 6:
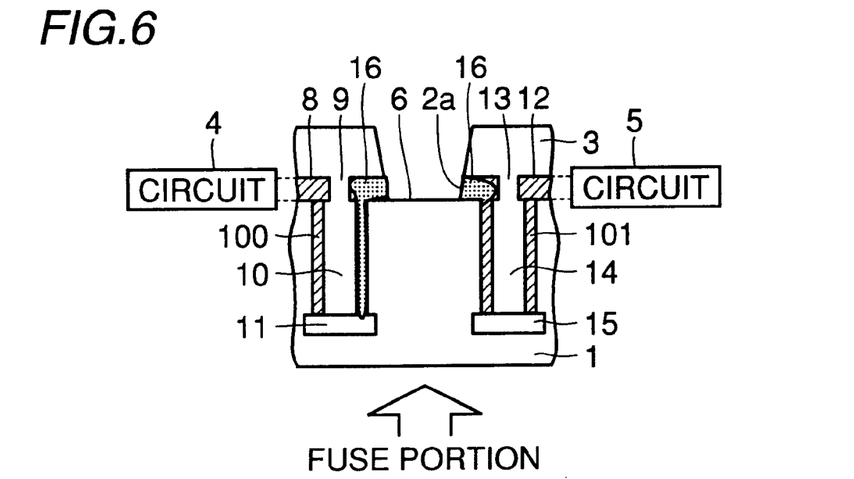
FIG. 6 is a cross sectional view of the device, taken along the line VI—VI in FIG. 5.

FIG. 5 is a top view of the semiconductor device illustrating an effect achieved by the semiconductor device according to the first embodiment. FIG. 6 is a cross sectional view of the device taken along the line VI—VI in FIG. 5. Referring to FIGS. 5 and 6, in the semiconductor device according to the first embodiment, fuse portion 2 is damaged by corrosion, same as the case of a conventional semiconductor device. More specifically, corrosion begins to proceed from an end surface 2a exposed by the cutting off of the fuse portion. In the semiconductor device according to the first embodiment, however, first and second connecting portions 9, 13, which are made of corrosion-resistant material, are interposed in the middle of fuse portion 2.

Since these portions 9, 13 prevent corrosion from advancing, interconnections in first and second circuits 4, 5 are kept from breaking, and therefore the device will encounter no defects. As can be seen in FIGS. 5 and 6, a corroded portion is denoted by a reference numeral 16. As described above, according to the first embodiment of the present invention, a device highly resistant to corrosion can be achieved, since connecting portions 9, 13, made of corrosion-resistant material, are interposed in the middle of fuse portion 2. As a result, it is no longer required to select a material resistant to corrosion for a fuse portion, and layout can be designed much more freely.

Second Embodiment

Figure 7:
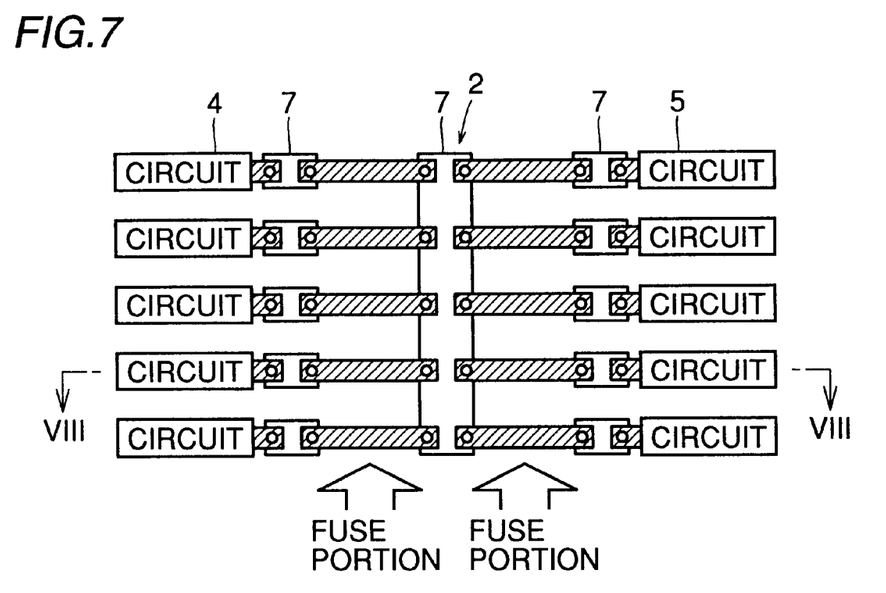
FIG. 7 is a top view of a semiconductor device according to a second embodiment of the present invention.

The device according to the second embodiment is same as the semiconductor device according to the first embodiment, except that the former has a fuse portion in which two separate portions are to be blown by laser respectively. Referring to FIG. 7, fuse portion 2 connects first circuit 4 and second circuit 5. In fuse portion 2, three connecting portions 7 are provided between first circuit 4 and second circuit 5, which is different from the arrangement according to the first embodiment.

Figure 8:
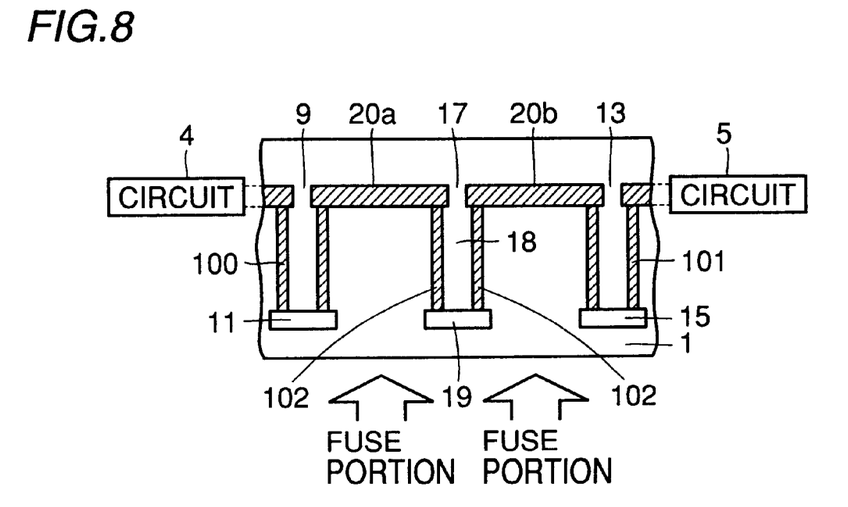
FIG. 8 is a cross sectional view of the device, taken along the line VIII—VIII in FIG. 7.

Referring to FIG. 8, the third connecting portion 17 located in the middle includes a third trench 18 formed on the surface of the semiconductor substrate 1, a third doped layer 19 formed at the bottom of third trench 18, and third plug portions 102 provided along third trench 18 and connecting third metal portions 20a, 20b respectively to third doped layer 19. Third metal portions 20a, 20b are made of Al, which is vulnerable to corrosion. On the other hand, third plug portions 102 are made of W or WSi, both of which are highly resistant to corrosion. Doped polysilicon layer 19 is never affected by corrosion.

Figure 9:
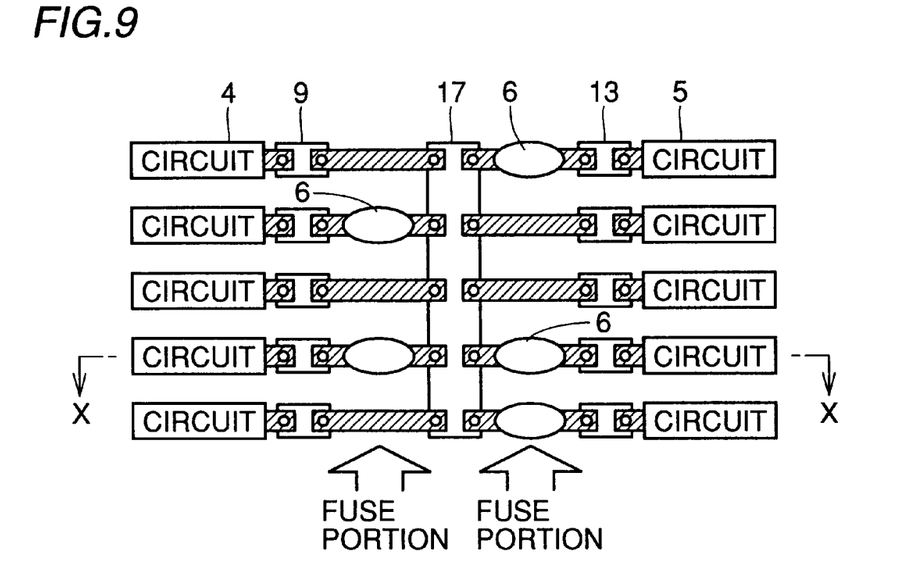
FIG. 9 is a top view of the semiconductor device after laser blowing has been performed.
Figure 10:
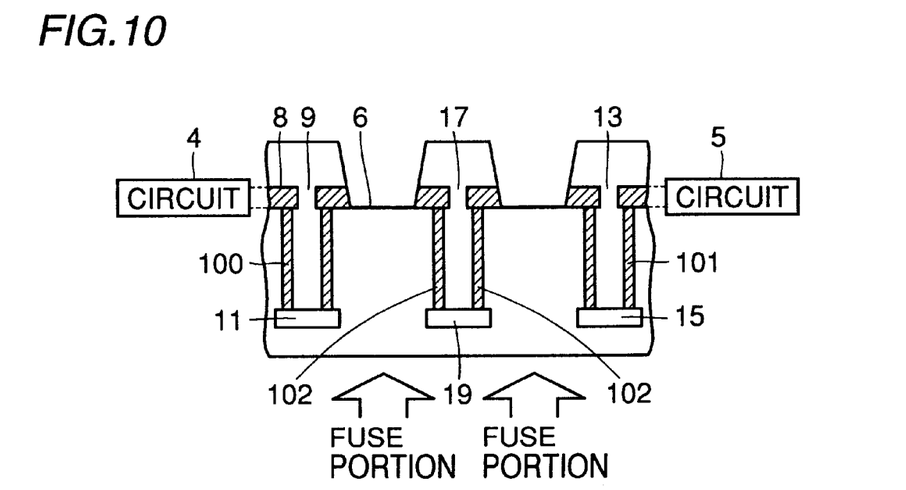
FIG. 10 is a cross sectional view of the device taken along the line X—X shown in FIG. 9.

FIG. 9 is a top view of the semiconductor device after laser blowing has been conducted. FIG. 10 is a cross sectional view of the device taken along the line X—X in FIG. 9. In FIGS. 9 and 10, a portion destroyed by laser is denoted by a reference numeral 6.

Figure 11:
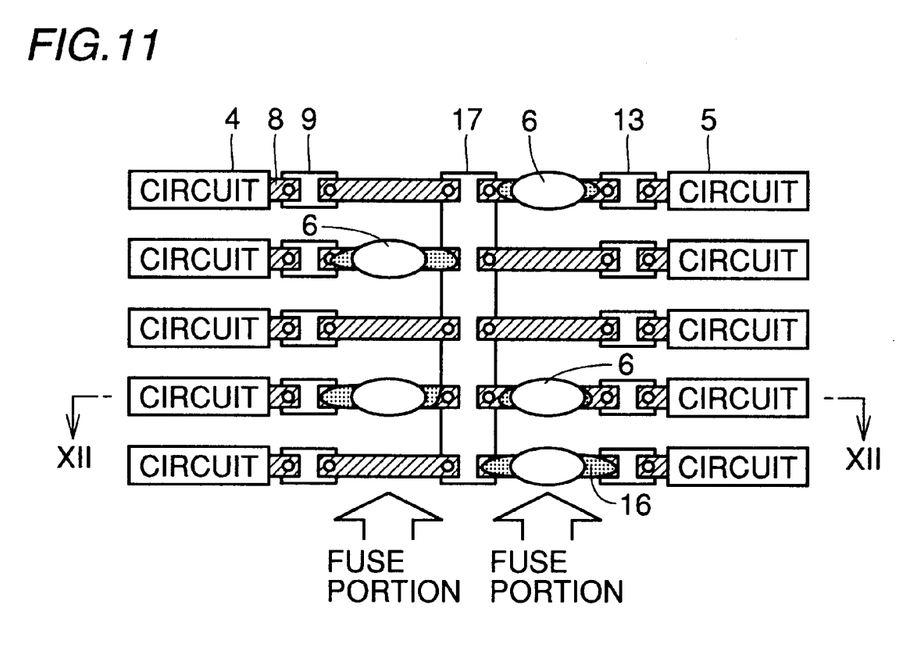
FIG. 11 is a diagram illustrating an effect provided by a semiconductor device according to the second embodiment of the present invention.
Figure 12:
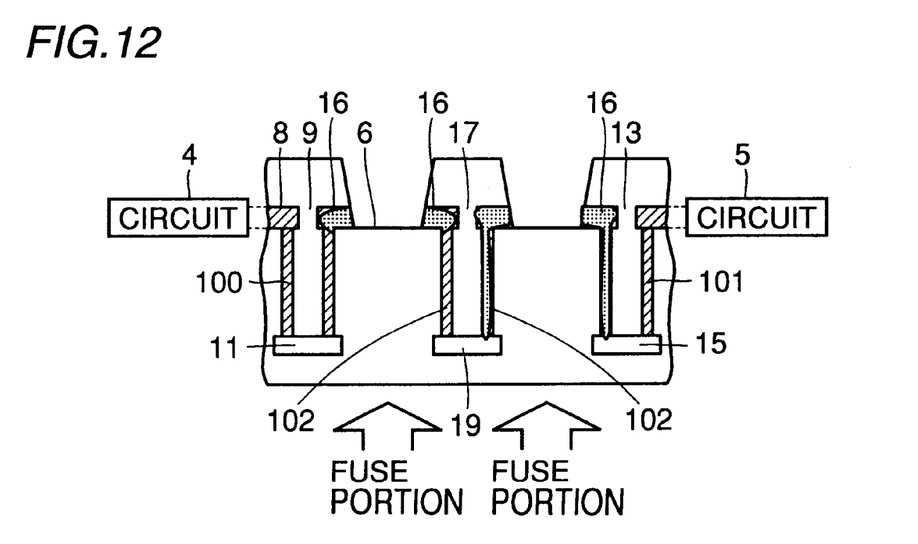
FIG. 12 is a cross sectional view of the device taken along the line XII—XII in FIG. 11.

FIG. 11 is a diagram illustrating an effect obtained by the semiconductor device according to the second embodiment. FIG. 12 is a cross sectional view of the device taken along the line XII—XII in FIG. 11. In FIGS. 11 and 12, any corroded portion is designated by a reference numeral 16. Like the device according to a first embodiment, the semiconductor device according to the second embodiment also suffers from corrosion. However, the first, second, and third connecting portions 9, 13, 17, made of corrosion-resisting material and provided in the middle of fuse portion 2, prevent the advance of corrosion, and thus the fuse portion is greatly improved in resistance to moisture. Accordingly, the destruction of interconnections in the circuits and other fuse portions can be avoided, whereby a good condition of the device is guaranteed.

As described above, in a semiconductor device according to a first aspect of the present invention, a connection portion made of corrosion-resisting material is interposed in the middle of a fuse portion. In such a structure, although the end surface of the blown fuse portion will be exposed, that connecting portion will prevent the advance of corrosion. As a result, the semiconductor device can be realized with a fuse portion having an increased resistance to moisture.

In a semiconductor device according to a second aspect of the present invention, the connecting portion is formed of the first doped layer highly resistant to corrosion. Therefore, even when an end surface of the first metal portion of the blown fuse portion is exposed and damaged by corrosion, the first doped layer will prevent corrosion from advancing any further. As a result, a semiconductor device with a fuse portion having an increased resistance to moisture can be realized.

In a semiconductor device according to a third aspect of the present invention, the first plug portion is made of Al, W, or WSi. Therefore, the fuse portion becomes easier to be blown by laser.

In a semiconductor device according to a fourth aspect of the present invention, the first doped layer is a doped polysilicon layer. This type of doped layer can be readily formed by simply doping a silicon substrate with impurities.

In a semiconductor device according to a fifth aspect of the present invention, the fuse portion is divided and separately arranged in two locations between the first circuit and the second circuit. Still in such a case, corrosion is successfully prevented from advancing, and therefore, a semiconductor device with an improved resistance to moisture can be realized.

In a semiconductor device according to a sixth aspect of the present invention, the second plug portion is formed of Al, W or WSi. Therefore, a fuse portion easy to be blown by laser can be obtained.

In a semiconductor device according to a seventh aspect of the present invention, the second doped layer is formed of a doped polysilicon layer. Therefore, it can be formed in a simple manner, by doping polysilicon with impurities.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate;
   a first circuit and a second circuit with a space therebetween, provided on said semiconductor substrate;
   a fuse provided on said semiconductor substrate between said first circuit and said second circuit;
   a first metal portion provided on said semiconductor substrate having one end connected to said first circuit;
   a first trench provided in a main surface of said semiconductor substrate between said fuse and said first metal portion;
   a first doped layer formed at a bottom of said first trench;
   a first plug provided at a sidewall surface of said first trench to electrically connect another end of said first metal portion with said first doped layer;
   a second plug provided at the sidewall surface of said first trench, spaced apart from said first plug, to electrically connect one end of said fuse with said first doped layer; and
   an insulating film provided on said semiconductor surface to fill in said first trench.

2. The semiconductor device according to claim 1, wherein said first plug portion is formed of W or WSi.

3. The semiconductor device according to claim 1, wherein said first doped layer is a doped polysilicon layer.

4. The semiconductor device according to claim 1, further comprising:
   a second metal portion provided on said semiconductor substrate, having one end connected to said second circuit;

a second trench provided in the main surface of said semiconductor substrate between said fuse and said second metal portion;

a second doped layer formed at a bottom of said second trench;

a third plug provided at a sidewall surface of said second trench to electrically connect another end of said second metal portion with said second doped layer; and a fourth plug provided at the sidewall surface of said second trench, spaced apart from said third plug, to electrically connect another end of said fuse with said second doped layer;

said insulating film also filling in said second trench.

5. The semiconductor device according to claim 4, wherein said second plug portion is formed of W or WSi.

6. The semiconductor device according to claim 4, wherein said second doped layer is a doped polysilicon layer.

* * * * *